US 6,627,866 B2

(12) United States Patent
Hula et al.

(10) Patent No.: US 6,627,866 B2
(45) Date of Patent: *Sep. 30, 2003

(54) OPTICAL BARRIER AND METHODS FOR FORMING THE OPTICAL BARRIER WITHOUT ETCHING A TRANSPARENT LAYER BELOW THE OPTICAL BARRIER

(75) Inventors: David W. Hula, Ft. Collins, CO (US); Robert G. Long, Ft. Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/971,433

(22) Filed: Oct. 5, 2001

(65) Prior Publication Data

US 2002/0092968 A1 Jul. 18, 2002

Related U.S. Application Data

(63) Continuation of application No. 09/356,560, filed on Jul. 19, 1999, now Pat. No. 6,326,601.

(51) Int. Cl.[7] .................. H01L 31/02; H01L 21/02
(52) U.S. Cl. .................. 250/208.1; 257/435; 438/69
(58) Field of Search .................. 250/208.1, 208.2, 250/214 R, 214.1; 257/9, 10, 59, 72, 215, 225, 258, 431, 435, 437, 443, 588; 438/57, 69, 572, 297, 582, 633

(56) References Cited

U.S. PATENT DOCUMENTS 6,326,601 B1 * 12/2001 Hula et al. .............. 250/208.1

* cited by examiner

Primary Examiner—Stephone B Allen

(57) ABSTRACT

An optical barrier made of tungsten (W) or titanium-tungsten (TiW). A layer of the optical barrier material is deposited over a transparent layer such as indium tin oxide (ITO). The optical barrier material is then patterned using photolithography processing steps and a dry etchant. The patterned optical barrier material acts as a light-shielding layer over a light-sensing device to form a dark reference device or dark pixel.

10 Claims, 4 Drawing Sheets

US 6,627,866 B2

OPTICAL BARRIER AND METHODS FOR FORMING THE OPTICAL BARRIER WITHOUT ETCHING A TRANSPARENT LAYER BELOW THE OPTICAL BARRIER

CROSS REFERENCE TO RELATED APPLILCATION(S)

This is a continuation of application Ser. No. 09/356,560 filed on Jul. 19, 1999 now U.S. Pat. No. 6,326,601B1.

FIELD OF THE INVENTION

The present invention pertains generally to integrated circuit fabrication and specifically to integrated circuits containing optical or imaging devices.

BACKGROUND OF THE INVENTION

Dark pixels are used in light sensing and imaging devices to compensate for components that are generated by causes other than light falling on a light sensor. These signal components may be referred to as dark current. To compensate for the dark current, one or more light sensors (also known as pixels) are prevented from receiving any light. These may be referred to as dark pixels. To compensate for the dark current, the outputs from the dark pixels may be subtracted from the outputs light receiving pixels to remove a component of the dark current from the outputs of the light receiving pixels.

To form a pixel, a photoelectric device is fabricated with a transparent layer. This transparent layer typically allows light to pass through to a light sensing region while still being conductive. By still being conductive, the transparent layer may be may be patterned and used as an electrode or other conductor in the formation of the light sensing or imaging device. This transparent layer may be selected from a group that includes indium tin oxide (ITO), tin oxide, zinc oxide, cadmium oxide, cadmium tin oxide, titanium oxide, and gold thin film.

To form a dark pixel, the light-receiving region of a pixel is covered with a shielding layer that prevents that pixel from receiving light. Prior art devices have constructed this light shielding layer from Aluminum (Al) or an Aluminum alloy such as Al—Si, Al—Ti, Al—Cu, Al—Si—Ti and Al—Si—Cu, or others.

Unfortunately, when it is desirable to place the light-shielding layer over the transparent layer, patterning these light-shielding materials is difficult. Extra processing steps and photomasks may be required to avoid damaging the transparent layer (e.g., ITO) when the light shielding layer is etched using typical etchants for these materials. Accordingly, there is a need in the art for a light shielding layer that may be easily etched without etching the transparent layer.

SUMMARY OF THE INVENTION

A preferred embodiment of the invention provides an optical barrier or light-shielding layer. This layer can be applied using known integrated circuit (IC) processing steps, but IC processing techniques developed in the future may also be suitable for applying this light-shielding layer. This layer can also be placed on top of a transparent layer, which preferably is indium tin oxide (ITO), and etched with an etchant that does not react adversely with the ITO. This allows the transparent layer to be an etch stop layer, which simplifies the number of processing steps required to construct a light-shielding layer on top of the transparent layer.

An optical barrier according to the invention preferably is comprised of tungsten (W) or titanium-tungsten (TiW). A layer of the optical barrier material is deposited over the transparent layer, which preferably is ITO. In accordance with one embodiment, the optical barrier material is patterned using known photolithography photoresist, processing steps, and hydrogen peroxide as an etchant. The patterned optical barrier may then act as a light-shielding layer over a light-sensing device to form a dark pixel. In accordance with another embodiment, the optical barrier is patterned using reactive ion etching (RIE), which is a dry etching process. Preferably, the dry etchant is a fluorine-based etchant. Using RIE to etch the optical barrier material layer enables fine line pattern definition of structures to be obtained in the W or TiW without any risk of damaging the transparent layer (e.g., ITO).

Other features and advantages of the present invention will become apparent from the following description, drawings and claims.

DETAILED DESCRIPTION OF THE PREFERRED EMBODIMENTS

Figure 1:
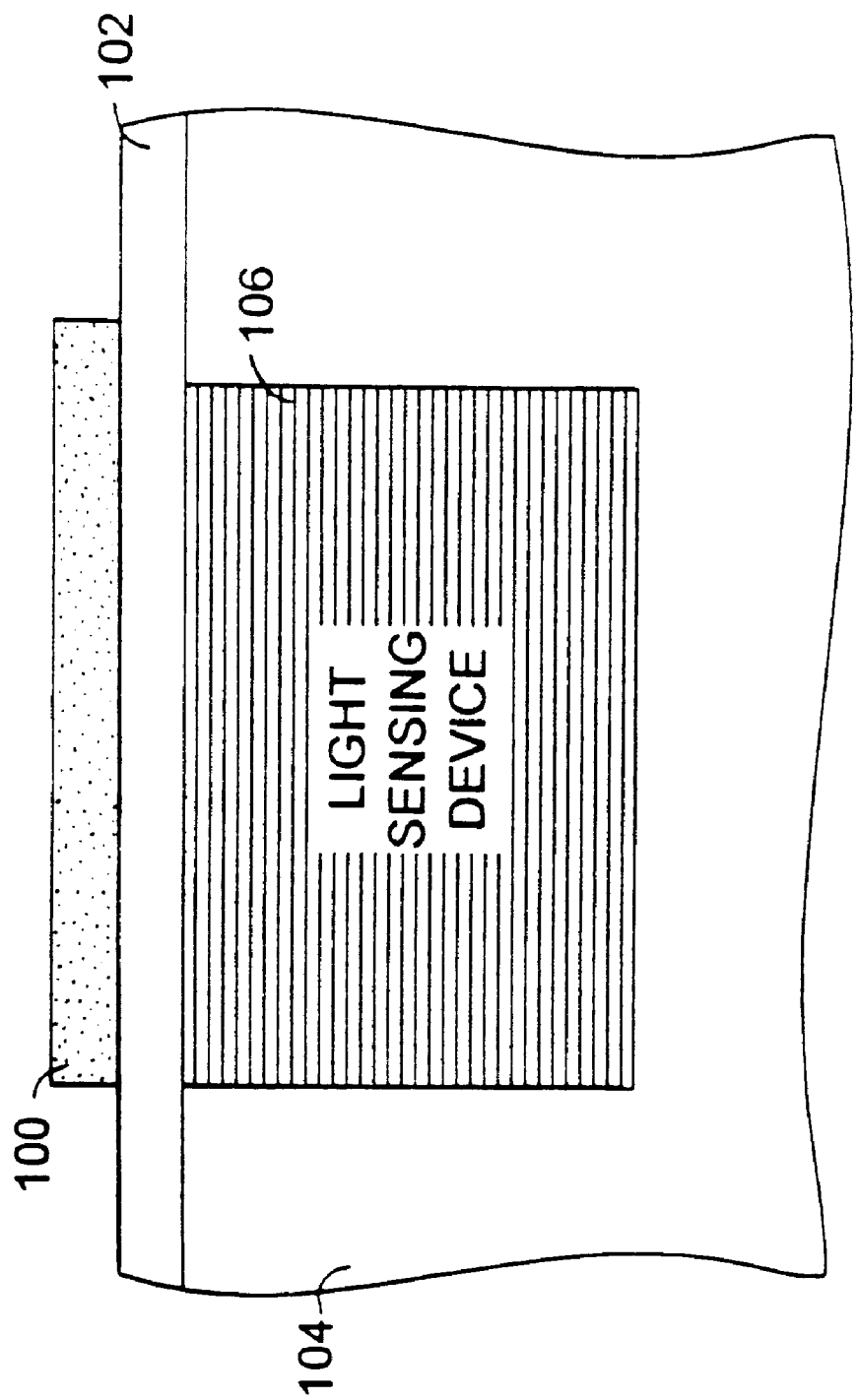
FIG. 1 is a cross-sectional illustration of a dark pixel with an optical barrier.

FIG. 1 is a cross-sectional illustration of a dark pixel with an optical barrier. A light-sensing device 106 is fabricated in or on a substrate 104. This light-sensing device 106 may be any kind of light-sensing device fabricated using any kind of material. Devices that this light-sensing device may be include a photodiode, a phototransistor, a charge-coupled device (CCD), a photovoltaic cell, a photoresistor, a photovaristor, or others. Materials used to construct these devices may include single crystalline silicon, amorphous silicon, polysilicon, cadmium sulfide, lead telluride, gallium arsenide, silicon carbide, germanium, germanium-silicon, or others. In accordance with the preferred embodiment, light-sensing device 106 is a photodiode constructed using amorphous silicon.

Deposited on top of the light-sensing device is a transparent layer 102. Transparent layer 102 allows light to pass through to a light-sensing region of light-sensing device 106 while still being conductive. By still being conductive, transparent layer 102 may be patterned and used as an electrode or other conductor in formation of the light-sensing device 106. Transparent layer 102 may be made from a material selected from a group that includes indium tin oxide (ITO), indium oxide, tin oxide, zinc oxide, cadmium oxide, cadmium tin oxide, titanium oxide, gold thin film or others.

On top of transparent layer 102 is optical barrier 100. Optical barrier 100 is made from tungsten (W) or titanium-tungsten (TiW). In accordance with the preferred embodiment, the optical barrier 100 is made from tungsten. In order to make optical barrier 100, a layer of W or TiW is deposited using a process such as physical vapor deposition (i.e., evaporation or sputtering), low pressure chemical vapor deposition (LPCVD), or others. This layer of W or TiW is then patterned using hydrogen peroxide as an etchant in a photoresist technique. In accordance with this embodiment, the optical barrier layer preferably is deposited using sputtering.

The layer of W or TiW is patterned such that it at least covers the light-sensing region of light-sensing device 106 forming optical barrier 100. The W or TiW layer may also be optionally patterned to establish conductive traces for wiring circuitry or construct additional opaque regions. Further processing layers, such as a passivation layer, may optionally be deposited over the light-sensing device 106 and optical barrier 100.

Figure 2:
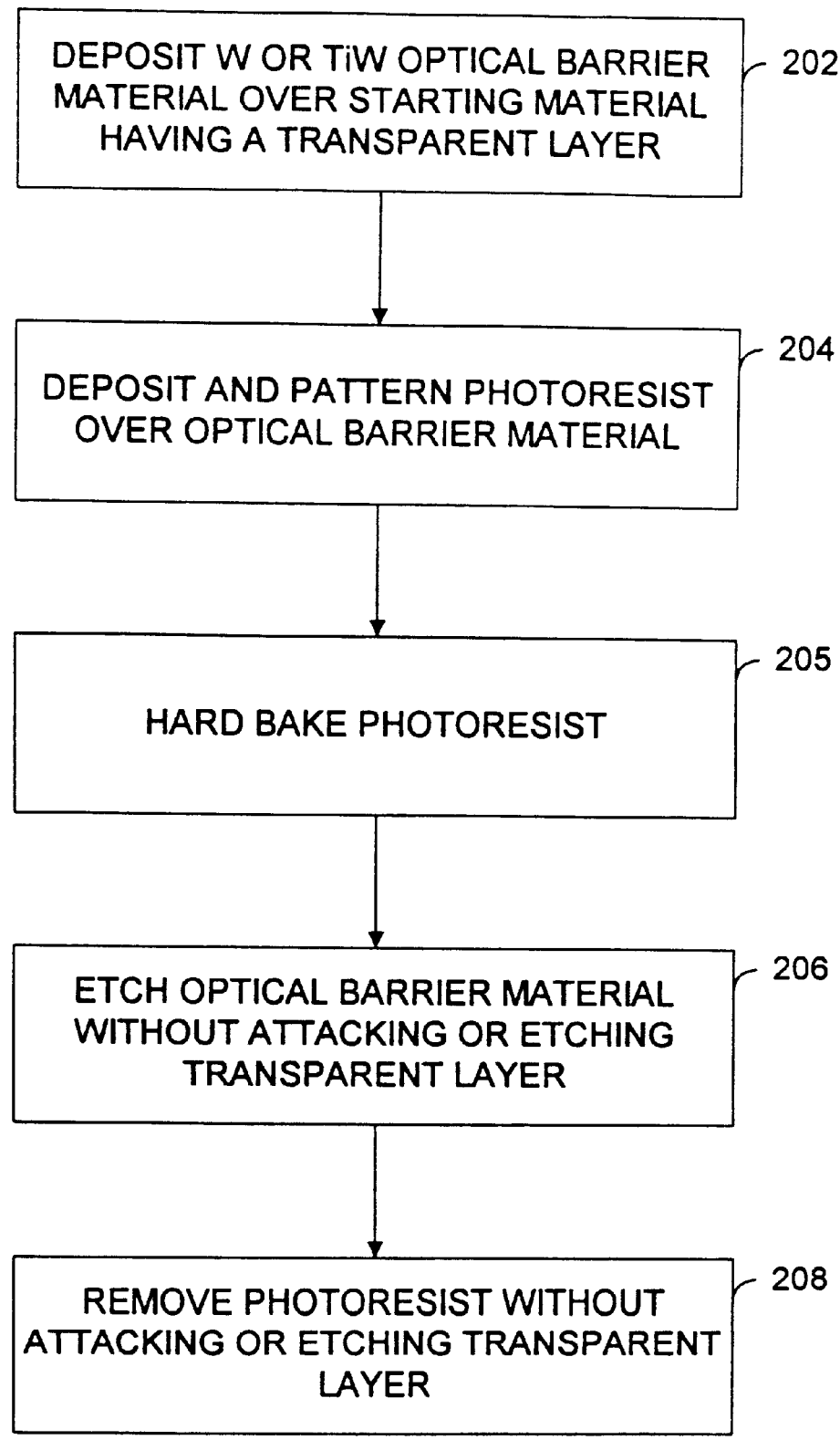
FIG. 2 is a flow-chart illustration of a process that can produce a tungsten or titanium-tungsten optical barrier in accordance with one embodiment of the present invention in which a wet etching process is used.

FIG. 2 is a flow-chart illustration of a process of the present invention that can produce a tungsten (W) titanium-tungsten (TiW) optical barrier. In a step 202, a layer of tungsten or titanium-tungsten is deposited over starting material having a transparent layer. In accordance with this embodiment, this starting material has a top transparent layer of indium tin oxide.

In a step 204, photoresist is deposited, selectively exposed, and developed over the W or TiW layer. Standard photoresist deposition, exposure, development, procedures may be used for this step. This resist is exposed and then developed. These processes pattern the photoresist such that it remains over the areas where the optical barrier and other W or TiW structures are desired.

In a step 205, the photoresist is hard baked such that it is made more resistant to attack by the wet etch. The photoresist is baked under ultraviolet (UV) light at 200° centigrade for 90 seconds.

In a step 206, the W or TiW layer is etched using a hydrogen peroxide solution. In this example embodiment, a 31% hydrogen peroxide solution at 40° C. is used to etch for 3.5 minutes. This removes the portions of the W or TiW layer that are not protected by the patterned photoresist resulting in the W or TiW layer being patterned. In this embodiment, hydrogen peroxide is used as an etchant because it does not significantly attack the transparent layer.

In a step 208, the photoresist is removed leaving a patterned W or TiW layer. The photoresist is removed using a wet chemical resist process with ACT NP-937 available from Ashland-ACT, Easton, Pa. a business unit of the Electronic Chemicals Division of Ashland Chemical Company (formerly Advanced Chemical Technologies). The layer of W or TiW is patterned such that it at least covers the light-sensing region of the light-sensing device forming an optical barrier over a dark pixel. Further processing steps, as adding a passivation layer, may then be employed to construct more device features in, around, and on the optical barrier.

While the $H_2O_2$ wet etching process discussed above with reference to FIG. 2 works well to remove most of the tungsten layer over the active pixel array, there are some cases in which residue may be left behind. Furthermore, wet etching may not always provide the precise control needed in order to etch narrow lines. In accordance with another embodiment of the present invention, a dry etching process is used to remove the tungsten layer over the active pixel array. In accordance with the present invention, it has been determined through experimentation that Reactive Ion Etching (RIE) of the W or TiW layer in a Fluorine-based plasma provides precise etching control of the W or TiW layer with very good selectivity without risking damage to the ITO layer.

Figure 3:
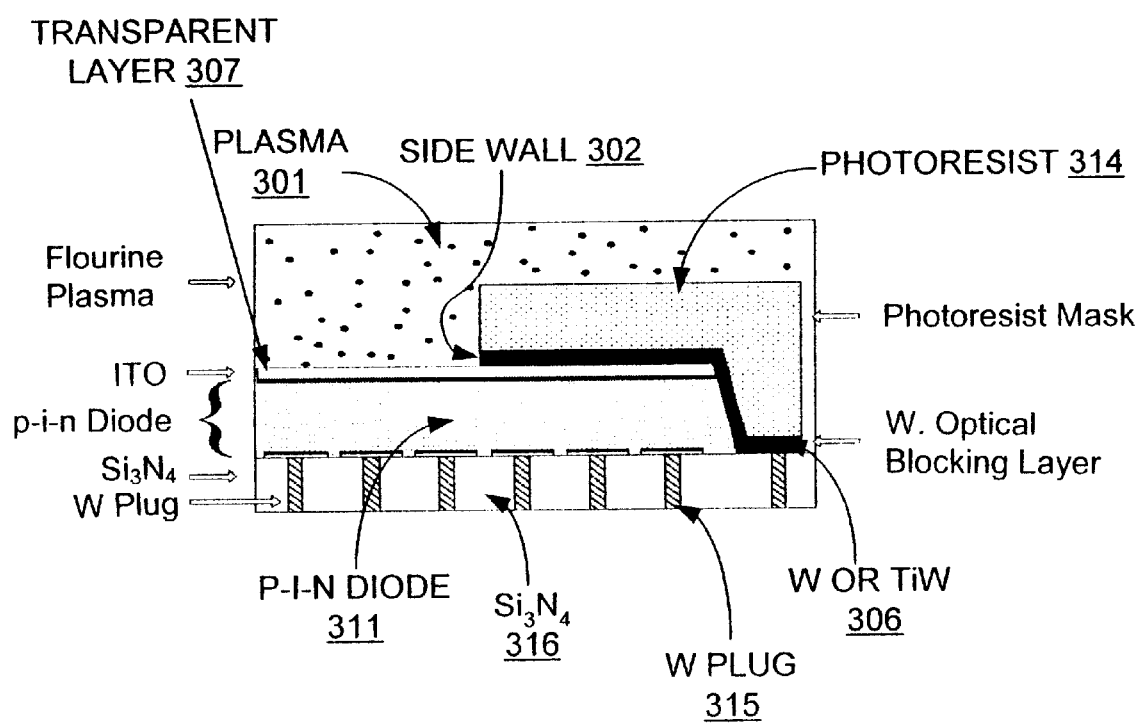
FIG. 3 is a cross-sectional illustration of a portion of a light-sensing device that shows the manner in which the dry etching process of the present invention etches away an optical barrier, such as a tungsten or titanium-tungsten optical barrier, without etching the transparent layer below it.

The following discussion of a particular experiment that was conducted will demonstrate the benefits of the dry etching process. In the experiment, the dry etching component selected was a $CF_4/O_2$ plasma. A schematic cross-sectional diagram of the results of using the fluorine-based RIE plasma etch in the process of patterning an opaque tungsten film is shown in FIG. 3. The $CF_4/O_2$ plasma is represented by numeral 301 in FIG. 3. As indicated by the anisotropic etched side wall 302 of the the optical barrier 306, RIE allows very fine line pattern definition of tungsten structures to be obtained without etching the transparent layer 307, which in the preferred embodiment, is comprised of indium tin oxide. In this embodiment, the device is a p-i-n diode. The transparent layer 307 covers the portion 311 of the p-i-n diode shown. The photoresist 314 is patterned and baked before etching the optical barrier 306. The tungsten plugs 315 formed in the $Si_3N_4$ layer 316 carry electrical current or voltage generated in response to light passing through the transparent layer 307 and impinging on the p-i-n diode region 311.

Tungsten etching in a fluorine-oxygen plasma is aimed at creating the volatile etch product $WF_6$ (BPT=17.5° C.) via the following surface reaction:

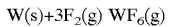

The amount of free fluorine available for this reaction in a $CF_4$ plasma is a function of both the applied DC bias current and the percentage of oxygen present in the plasma.

In this example experiment, tungsten films deposited on silicon dioxide coated silicon wafers were used to calculate the tungsten etch rate. Before etching, the tungsten film thickness was measured using a 49-point four-point-probe (RS-75). The tungsten films were then partially etched in the $CF_4/O_2$ plasma under various process conditions, and the thickness was again measured. In this way, the tungsten etch rate could be determined as a function of both oxygen percentage and applied DC bias current by dividing the films thickness loss by the process time.

ITO etch rates were determined in a similar manner just describe for the tungsten films. ITO films were etched under similar process conditions (process chemistry, gas flows, process pressure, etc.) as those used to etch the tungsten films. Film thickness was measured using both a 49-point four-point-probe (RS-75) and an optical interferometer (UV-1250). The thickness of the ITO films were measured both before and after exposure to the $CF_4/O_2$ plasma. In this way the ITO etch rates could also be determined as a function of oxygen percentage. It was found that the reduction in ITO thickness was less than 5 Å for all process condition tested. This result is not surprising since the halides of either indium or tin are not volatile at 60° C. (the process temperature). The tungsten etch rate, the ITO etch rate, and the ratio of the etch rates of W to ITO (selectivity) as a function of oxygen percentage were all determined.

The large values of etch rate selectivity indicated that product wafers can be subjected to overetch conditions for a long periods of time without loss of the ITO layer. The ITO layer acts as a very effective etch stop layer for the tungsten etch.

Bi-layer films of tungsten and ITO deposited on silicon substrates were patterned with photoresist and then etched using the following process:

TABLE 1

| Process Parameter | Value |
|---|---|
| $CF_4$ | 200 sccm |
| $O_2$ | 50 sccm |
| Pressure | 22 mTorr |
| DC Bias | −220 Volts |
| Process Time | 5 and 8 minutes |

Wafers were etched for 5 minutes and 8 minutes. This resulted in over etch times of 1 minute and 4 minutes respectively. Examination of micrograph cross-sections indicated that the tungsten layer was completely removed by the etching wherever there was no photoresist and that the additional over-etching did not remove any of the ITO layer and left no tungsten residue. Also, the tungsten sidewalls were not undercut, but rather, were slightly sloped, which is desirable when etching. The conclusion of the experiments was that RIE etching of tungsten films deposited on ITO layers in a $CF_4/O_2$ plasma has several advantages over previous wet chemical processes, including:

(1) High selectivity to the ITO under layer;
(2) Fine line patterning without undercutting the tungsten pattern; and
(3) No tungsten residue.

Figure 4:
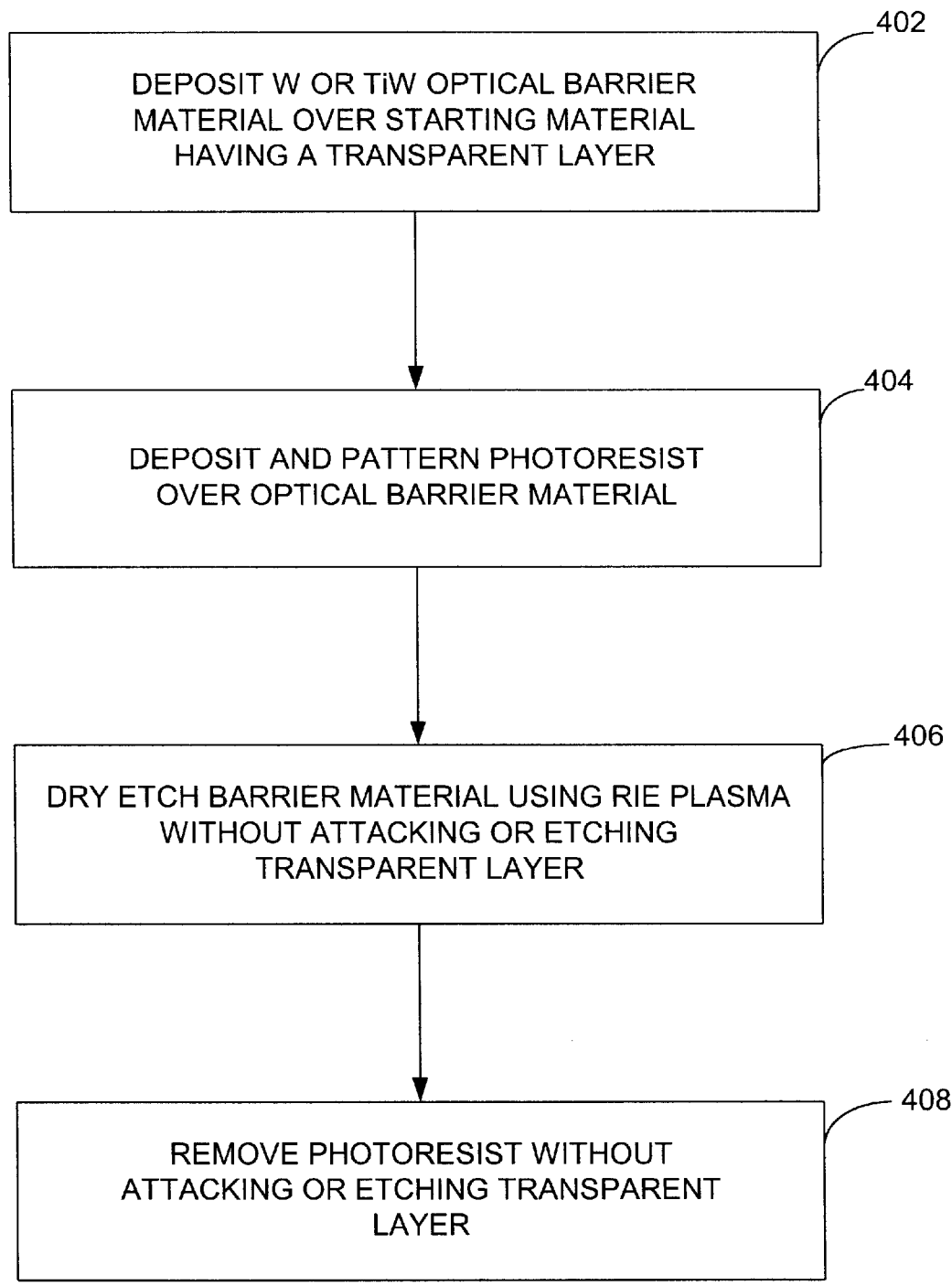
FIG. 4 is a flow-chart illustration of a process that can produce a tungsten or titanium-tungsten optical barrier in accordance with another embodiment of the present invention in which a dry etching process is used.

FIG. 4 is a flow chart illustrating the dry etching technique of the present invention. The steps represented by blocks 402, 404 and 408 can be identical to the steps represented by blocks 202, 204 and 208, respectively, in FIG. 2. The RIE dry etching step with a fluorine-based plasma is represented by block 406.

It should be noted that the present invention has been discussed with reference to preferred and example embodiments. The present invention is not intended to be limited to these embodiments. For example, the present invention is not limited to the processing conditions discussed above. The processing conditions described herein are merely for purposes of demonstration of particular implementations as well as for the purpose of demonstrating that a variety of processing conditions are suitable for achieving the goals of the present invention. Those skilled in the art will understand, in view of the discussion provided herein that many modifications may be made to the embodiments specifically described herein without deviating from the scope of the present invention.

What is claimed is:

1. A method of forming an optical barrier, comprising:
   depositing an optical barrier material comprised of tungsten over a transparent layer; and
   patterning said optical barrier material by selectively etching away portions of the optical barrier using a reactive ion etching technique.

2. The method of claim 1, wherein said patterning leaves said optical barrier over at least one light-sensing element.

3. The method of claim 1, wherein the reactive ion etching technique utilizes a fluorine-based plasma.

4. The method of claim 3, wherein the fluorine-based plasma is a $CF_4/O_2$ plasma.

5. The method of claim 1, wherein the reactive ion etching technique does not substantially remove any of the transparent layer.

6. A method of forming an optical barrier, comprising:
   depositing an optical barrier material comprised of titanium-tungsten over a transparent layer; and
   patterning said optical barrier material by selectively etching away portions of the optical barrier using a reactive ion etching technique.

7. The method of claim 6, wherein said patterning leaves said optical barrier over at least one light-sensing element.

8. The method of claim 6, wherein the reactive ion etching technique utilizes a fluorine-based plasma.

9. The method of claim 8, wherein the fluorine-based plasma is a $CF_4/O_2$ plasma.

10. The method of claim 6, wherein the reactive ion etching technique does not substantially remove any of the transparent layer.

* * * * *